United States Patent
Nishida et al.

(10) Patent No.: US 7,723,720 B2
(45) Date of Patent: May 25, 2010

(54) METHODS AND ARTICLES INCORPORATING LOCAL STRESS FOR PERFORMANCE IMPROVEMENT OF STRAINED SEMICONDUCTOR DEVICES

(75) Inventors: Toshikazu Nishida, Gainesville, FL (US); Scott E. Thompson, Gainesville, FL (US); Al Ogden, Gainesville, FL (US); Kehuey Wu, Kaohsiung (TW)

(73) Assignee: University of Florida Research Foundation, Inc., Gainesville, FL (US)

( * ) Notice: Subject to any disclaimer, the term of this patent is extended or adjusted under 35 U.S.C. 154(b) by 16 days.

(21) Appl. No.: 11/568,863

(22) PCT Filed: Nov. 9, 2005
(Under 37 CFR 1.47)

(86) PCT No.: PCT/US2005/040917

§ 371 (c)(1),
(2), (4) Date: Sep. 5, 2008

(87) PCT Pub. No.: WO2006/053213

PCT Pub. Date: May 18, 2006

(65) Prior Publication Data
US 2009/0072371 A1 Mar. 19, 2009

Related U.S. Application Data

(60) Provisional application No. 60/626,226, filed on Nov. 9, 2004.

(51) Int. Cl.
*H01L 31/00* (2006.01)
(52) U.S. Cl. .......................... 257/18; 257/417; 257/419; 257/254
(58) Field of Classification Search .................. 257/419, 257/417, 257, 254
See application file for complete search history.

(56) References Cited

U.S. PATENT DOCUMENTS

| | | | |
|---|---|---|---|
| 3,195,218 A | | 7/1965 | Miller et al. |
| 4,777,826 A | * | 10/1988 | Rud et al. ...................... 73/708 |
| 4,969,031 A | | 11/1990 | Kobayashi et al. |
| 5,081,513 A | | 1/1992 | Jackson et al. |

(Continued)

FOREIGN PATENT DOCUMENTS

EP 0380077 A 8/1990

(Continued)

OTHER PUBLICATIONS

Brantley, W. A. "Calculated elastic constants for stress problems associated with semiconductor devices". J. Appl. Phys. vol. 44, No. 1, p. 535. 2001.*

(Continued)

*Primary Examiner*—A. Sefer
*Assistant Examiner*—Allen L Parker
(74) *Attorney, Agent, or Firm*—Thomas, Kayden, Horstemeyer & Risley, LLP

(57) ABSTRACT

A packaged semiconductor device (450) includes a semiconductor chip (400) having at least one selectively thinned substrate (cavity) region (410). A package (460) is provided for mounting, enclosing and electrically connecting the chip (400) to the outside world, and structure for applying external stress (470) to induce strain in the thinned substrate region (410). The external stress is preferably adjustable, such as by varying the gas flow (or a vacuum) applied through a pressure valve.

14 Claims, 6 Drawing Sheets

U.S. PATENT DOCUMENTS

| | | | |
|---|---|---|---|
| 6,169,316 B1 * | 1/2001 | Sakai et al. | 257/419 |
| 6,218,717 B1 * | 4/2001 | Toyoda et al. | 257/419 |
| 6,429,061 B1 | 8/2002 | Rim et al. | |
| 6,514,836 B2 | 2/2003 | Belford | |
| 6,928,878 B1 * | 8/2005 | Eriksen et al. | 73/724 |
| 2003/0040158 A1 * | 2/2003 | Saitoh | 438/279 |
| 2003/0107095 A1 * | 6/2003 | Kurtz | 257/414 |
| 2003/0143783 A1 | 7/2003 | Maa et al. | |
| 2004/0012062 A1 * | 1/2004 | Miyajima et al. | 257/419 |
| 2006/0099772 A1 * | 5/2006 | Yu et al. | 438/455 |

OTHER PUBLICATIONS

"http://www.efunda.com/materials/common_matl/common_matl.cfm?MatIPhase=Solid&MatIProp=Mechanical" as it appeared Jul. 24, 2001 as demonstrated by included archive.org attachment.*

* cited by examiner

US 7,723,720 B2

METHODS AND ARTICLES INCORPORATING LOCAL STRESS FOR PERFORMANCE IMPROVEMENT OF STRAINED SEMICONDUCTOR DEVICES

CROSS-REFERENCE TO RELATED APPLICATIONS

This application is the national stage entry of International Application No. PCT/US2005/040917, filed Nov. 9, 2005, which claims priority to U.S. Provisional Application No. 60/626,226, filed Nov. 9, 2004, the disclosures of both of which are hereby incorporated by reference.

FIELD OF THE INVENTION

The present invention relates generally to semiconductor structures and more particularly to semiconductor structures formed on strained semiconductor layers.

BACKGROUND

There has been significant research and development activity regarding surface strain to enhance the mobility of carriers in the inversion channel of field-effect transistors (FETs) as a method to continue improve device performance. Recently, it has been shown that the incorporation strain via internal stress on the order of 100 to 1000 MPa (1 GPa) in the surface regions of integrated circuits improves the performance of both n-channel metal-oxide-semiconductor (NMOS) transistors and p-channel metal-oxide-semiconductor (PMOS) transistors. Devices with strained silicon surface channels have demonstrated improved performance with higher drive currents and higher switching speeds.

For example, biaxial tensile strain, introduced by lattice mismatch between a fully relaxed $Si_{1-x}Ge_x$ layer and a thin epitaxial Si layer below the transistors, has been shown to increase both electron and hole mobilities. However, the hole mobility improvement is known to degrade at high electric fields. For longitudinal uniaxial strains, different strain polarities, negative-compressive for PMOS and positive-tensile for NMOS, have been shown to result in mobility increases. These uniaxial strains can be obtained via a tensile silicon nitride capping layer used as a channel elongator for NMOS transistors and internal stresses exerted by a selective $Si_{1-x}Ge_x$ spacer layer employed as a channel compressor in PMOS. In both the capping layer and spacer layer embodiments, the stress layer is disposed on the front of the die.

The implementation of these strains for complementary MOS (CMOS) process improvement requires significant modification of the standard CMOS process flow to incorporate the stresses, and thus results in a significant increase in cycle time and processing cost. Moreover, conventional surface strain techniques introduce the strain in front-end process steps which are before the high temperature source/drain (S/D) anneal. The S/D anneal is generally the final high temperature step (e.g. 950° C.) in a given CMOS process. Such high temperature processing after strain introduction limits the magnitude of the strain that can be achieved due to strain relaxation. As a result, current approaches are generally limited to stress of no more than about 1 GPa. In addition, once set by the process, the stress and resulting strain is not adjustable.

Instead of process-induced strain, external mechanical stress applied using a four-point bending apparatus has been disclosed to modify carrier transport as a function of bending-induced uniaxial strain. A variation of this method may be also employed to yield bending-induced biaxial strain. While such a bending apparatus may have merit for laboratory studies of strain effects on carrier transport, such an apparatus is clearly not suitable for integration into the CMOS process nor easily implemented in an IC package.

SUMMARY

A packaged semiconductor device comprises a semiconductor chip having at least one selectively thinned substrate region, a package for mounting, enclosing and electrically connecting the chip to the outside world, and a structure for applying external stress to induce strain in the thinned substrate region. The stress in the thinned substrate region can be at least 1 GPa, such as 2 GPa or 3 GPa. The external stress is preferably adjustable.

The thinned substrate region preferably has a thickness of less than 1 μm. In one embodiment, the package includes a port fluidly connect to an inside of the package with a region outside of the package for accepting a vacuum or a pressurized gas flow. In another embodiment, the package lid provides a curved top surface protrusion which is compressed against the thinned substrate region. Internal stress can also be applied. The device can also comprise a thin film having substantial residual stress disposed on a backside of the thinned substrate region, such as a layer of silicon nitride.

In another embodiment, the chip is a composite device comprising a thinned substrate device layer having a Young's modulus $E_2$ disposed on a substantially thicker substrate, the thicker substrate having a Young's modulus $E_1$, where $E_2 > E_1$. A lower bending force is required to bend such a composite device since compliance is dominated by the thicker substrate. Since strain is proportional to stress and inversely proportional to the Young's modulus, a substantial stress amplification occurs in the thinned device layer.

A method of increasing integrated circuit performance using strained MOSFET devices comprising the steps of micromachining a semiconductor chip after source/drain (S/D) anneal processing to selectively form at least one thinned substrate region, and applying at least one of external and internal stress to induce strain in the thinned substrate region. The micromachining can comprise globally thinning the chip using chemical-mechanical polishing (CMP), grinding, or an etchback process. In another embodiment, the micromachining comprises local thinning using an anisotropic deep reactive ion etch (DRIE) process. The external stress is preferably adjustable.

The method can include the step of applying internal stress comprising depositing a thin film layer having substantial residual stress on said thinned substrate region, such as silicon nitride. The applying external stress step can comprises applying an externally imposed pressure difference the thinned substrate region. The chip can be disposed in a package, where the method can further comprise the step of pressurizing the package, wherein the pressurizing generates a differential pressure across the thinned substrate region. In another embodiment, the applying external stress step can comprise applying an external force via a lid having curved top surface that is compressed onto the thinned substrate region.

BRIEF DESCRIPTION OF THE DRAWINGS

A filler understanding of the present invention and the features and benefits thereof will be accomplished upon review of the following detailed description together with the accompanying drawings, in which.

DETAILED DESCRIPTION

Figure 1:
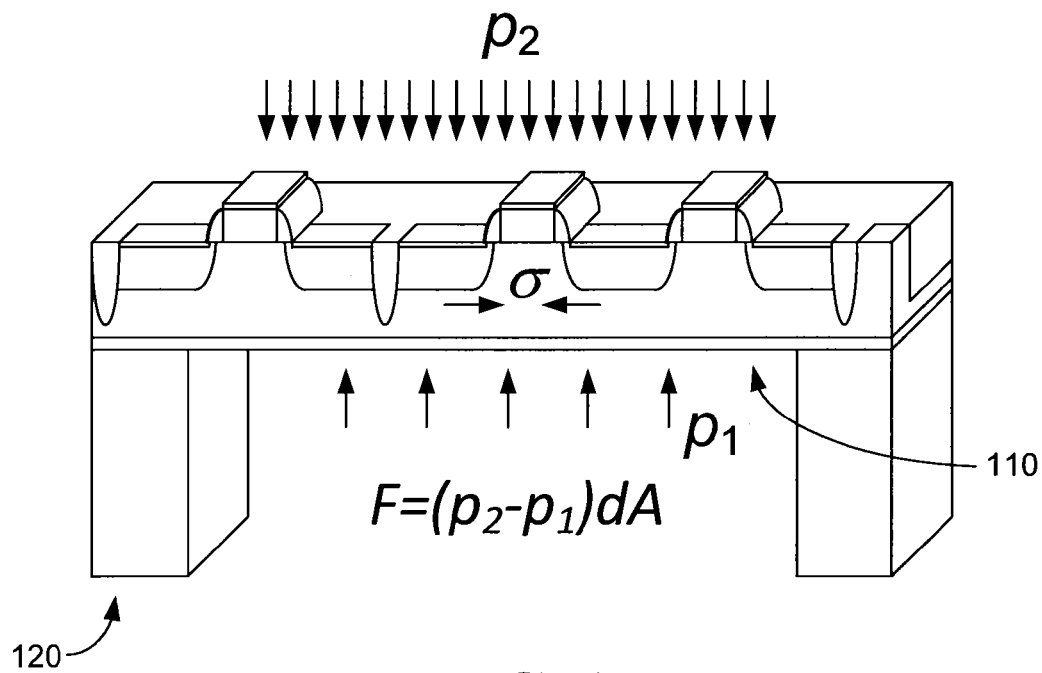
FIG. 1 shows local incorporation of stress using a locally thinned CMOS substrate with application of an external pressure difference, according to an embodiment of the invention.

A method of forming strained semiconductor devices includes the steps of micromachining a semiconductor chip after source/drain (S/D) anneal in a semiconductor process to selectively form at least one thinned substrate region. Forming the thinned substrate region(s) after S/D anneal according to the invention overcomes a major deficiency of conventional surface strain techniques. Such conventional techniques introduce the strain in front-end process steps which are before the high temperature source/drain (S/D) anneal which are substantially strain relaxed by the S/D anneal resulting in applied stress of no more than about 1 GPa.

The thinned substrate region is generally 100 nm to 1 μm thick, and generally less than 500 nm, such as the 200 nm Si surface layer generally provided by available silicon on insulator (SOI) substrates. Silicon on insulator substrates are preferred substrates for use with the invention since the buried oxide layer provides a convenient etch stop when removing the Si substrate region disposed below the buried oxide layer to form the thinned substrate regions as described below. The thinned substrate regions can be contrasted with areas of the substrate that are not thinned, which are typically about 500 μm.

Because the thinned substrate region(s) are formed after S/D anneal in a preferred embodiment of the invention, strain levels attainable in the thinned substrate region(s) are higher than conventional processes in which thinning of the substrate occurs before the high temperature S/D anneal which acts to relieve strain. Due to the higher attainable strains attainable using the invention, the channel regions for transistors formed in the thinned substrate regions (referred to as IC plate(s)) provide enhanced performance for both PMOS and NMOS transistors due to significantly improved hole and electron mobilities in the strained thin substrate regions. Furthermore, the thermal conduction of the thinned chip regions will be improved by the invention, increasing the thermal heat dissipation, and resulting in lower circuit operating temperatures and as a result higher circuit reliability.

Although described generally relating to Si substrates, the invention is in no way limited. For example, substrates can include Si/Ge, and various III-V substrates (e.g. GaAs), as well as II-VI substrates. (e.g. GaN). With regard to GaN, a small change in lattice constant provided by applied stress can result in a large change in carrier mobility. Moreover, the invention can be applied to processes other than CMOS, including bipolar devices, or for combined processes such as BIMOS.

The semiconductor IC chip may be thinned globally using chemical-mechanical polishing (CMP), grinding/lapping, an etchback process, or locally preferably using an anisotropic deep reactive ion etch (DRIE) process. When using an SOI wafer, the buried oxide layer provides an etch stop which permits the selective removal of the underlying thick substrate region to leave a thin silicon surface layer (about 200 nm) on top of an oxide layer of about 1 μm. The oxide layer is then generally removed, but can be retained. It may also be possible to use a conventional bulk substrate using a timed etch to form thinned substrate regions, or an in-situ technique which monitors the thickness of the thinned regions as the etch process proceeds. In one embodiment, etchback processing with SOI substrates utilizes KOH to remove the bulk silicon, leaving the thin silicon epitaxial surface layer.

Using a preferred local etch process, both small region (~1 μm) and large region (~100 μm) uniaxial and biaxial stress can be applied through the backside of the die through proper selection of the size and geometry of the micromachined back cavities. For example, circular geometries generally produce biaxial stress, while high aspect ratio geometries generally produces uniaxial stress. As used herein, the phrase "high aspect ratio" refers to an in-plane length of the thinned substrate region shape divided by its width. For example, a long thin rectangular geometry will provide a generally uniaxial stress. The magnitude of the stress will generally increase as the thickness of the thinned region is decreased.

The stress may be applied through a pressure difference across the IC plate or by external application of a force via a suitable contacting structure. In both of these embodiments, the magnitude of the stress can be adjusted by varying the pressure difference or external force applied by the contacting structure. Such external application of stress may be incorporated into new packages described below that provide the contacting structure which applies the stress.

Additionally, back-end processing occurring after the S/D anneal involving the deposition of a thin film having substantial residual stress therein can be deposited on the backside of the thinned substrate. As used herein, the phrase "substantial residual stress" refers to an in-plane stress level of at least 500 MPa, and more preferably greater than 1 GPa. Although a thin layer of Au may be deposited on the backside of a wafer in a conventional process to provide enhanced electrical contact to the die, the Au layer provides negligible stress.

Silicon nitride is a preferred thin film having residual stress since it can be deposited at low temperature (e.g., PECVD at 350-480° C.) and has high levels of stress that can be adjusted by changing reactant gas ratios to achieve varying levels of silicon to nitrogen ratio. For example, excess $SiH_2Cl_2$ flow relative to the $NH_3$ flow provided will produce a silicon rich silicon nitride layer, while an excess of $NH_3$ will produce a silicon deficient silicon nitride layer. In this manner, silicon nitride deposited in the range of 10 to 100 nm thickness can be made compressive up to 3 GigaPascal (GPa) and tensile up to 2.5 GPa.

Other residual stress providing layers may also be used, provided they can generally be deposited at a temperature of less than about 500° C. For example, tungsten may also be used.

The thickness of the stress layer is generally from 100 nm to 1 μm. The stress layer may be deposited locally using a lithographic or etch process, or be applied to the whole backside of the wafer. Two separate deposition steps may be used for the stress layer applied to the back of the wafer to provide different stress layer characteristics. It is also possible to use local annealing processes (e.g. laser annealing) to produce localized changes in the morphology and as a result the stress of a given as-deposited stress layer.

This backside stress layer embodiment may be generally utilized without any other changes to conventional processing or packaging. Alternatively, the backside stress layer embodiment may be combined with other embodiments described herein.

FIG. 1 shows local incorporation of stress using a locally thinned CMOS Si substrate with application of an external pressure difference, according to an embodiment of the invention. Thinned region is denoted 110, while the thick region is denoted 120. In this case, the pressure difference is $P_2$-$P_1$, where $P_2$ is applied on the top side of the chip, while $P_1$ is applied to the back of the chip. The resulting stress which is uniaxial or biaxial depending on the geometry of the thinned region 110 as described above induced in the thin silicon or other channel region is shown as σ. Such a pressure difference can be induced using a novel package, such as the package shown in FIG. 4(c) as described below.

Figure 2:
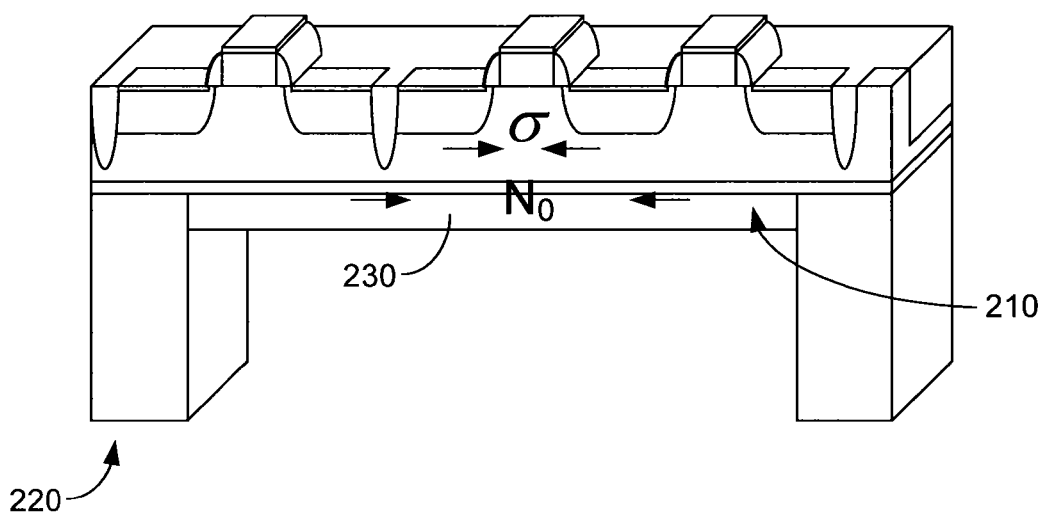
FIG. 2 shows incorporation of local stress via selective deposition of a thin film having residual stress therein on a locally thinned CMOS substrate, according to an embodiment of the invention.

FIG. 2 shows an alternate embodiment of the invention which may be combined with the application of external stress according to the invention as described above, or used without externally applied stress. In this embodiment, local stress is incorporated via selective deposition of a thin film layer 230 having residual stress on a locally thinned CMOS substrate 210 according to the invention. Thick region is denoted 220. Low temperature capable deposition processes including low-pressure chemical vapor deposition (LPCVD) and plasma enhanced chemical vapor deposition (PECVD) can be used to deposit the stressed thin film layer. Significantly, as noted above, the residually stressed thin film layer 230 is deposited after the S/D anneal, thus avoiding strain relief that is known to occur following the S/D anneal using conventional surface strain inducing processes. In a preferred embodiment, the DRIE etched cavities are formed after the S/D anneal, such as after metallization or even passivation processing. The notation "$N_o$" stands for in-plane stress (N/m²).

Figure 3:
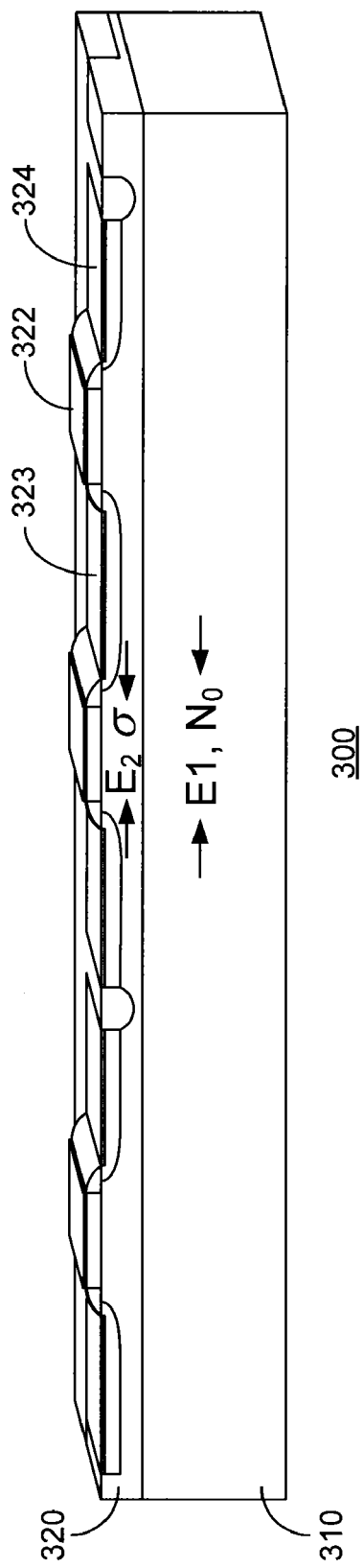
FIG. 3 shows a composite device comprising a thinned CMOS substrate device layer having a Young's modulus $E_2$ disposed on a substantially thicker substrate with a lower Young's modulus $E_1$ ($E_2 > E_1$).

In another embodiment of the invention, a device comprising a composite thinned CMOS substrate with a thick compliant substrate for enhanced strain is disclosed. Referring to FIG. 3, composite device 300 comprises a thinned CMOS substrate device layer 320 having a Young's modulus $E_2$ disposed on a thicker substrate 310 with a lower Young's modulus ($E_1$) is shown. A MOS transistor comprising source 323, gate 322 and drain 324 is formed in/on device layer 320. No metal interconnect is shown. $E_2$ is generally from 10 to 1000 times larger than $E_1$, such as 100 $E_1$. High strength adhesives can be used for laminating device layer 320 to substrate 310, such as using cyanoacrylates, epoxy, or similar high strength adhesive materials. Alternatively, other bonding processes may be used to bond device layer 320 to substrate 310.

Substrate 310 is substantially thicker than the thickness of device layer 320. As used herein, "substantially thicker" refers to a thickness of substrate 310 that is at least ten (10) times the thickness of device layer 320. The strain provided in this arrangement is continuous at the interface between substrate 310 and device layer 320. A lower bending force is required to bend composite device 300 since compliance is dominated by substrate 310 which is substantially thicker than device layer 320. Since strain is proportional to stress and inversely proportional to the Young's modulus, a stress amplification occurs in the thinned CMOS device layer 320.

Figure 4:
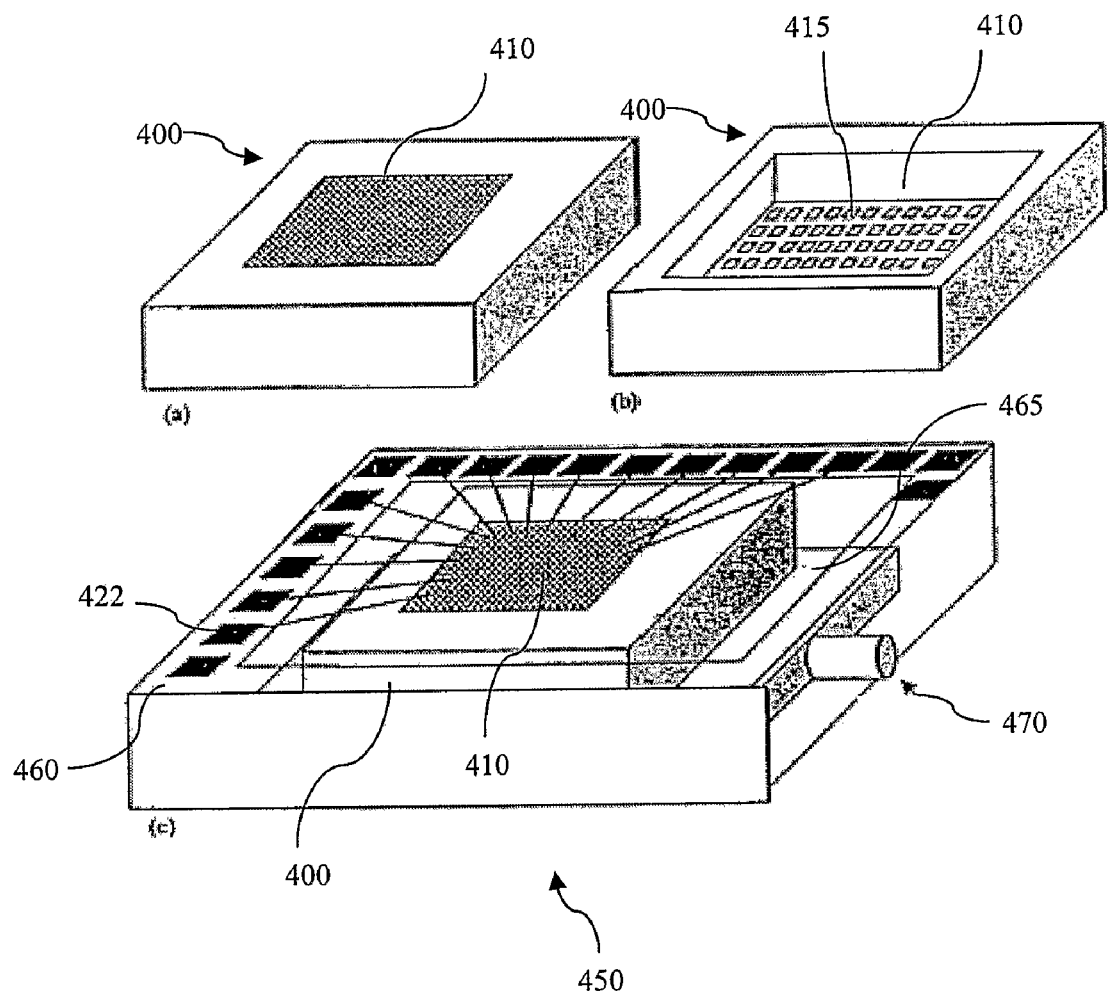
FIG. 4(a) shows a top view of a thinned IC chip.
FIG. 4(b) a bottom view of thinned IC chip illustrating a main cavity and a plurality smaller sub-cavities for single transistor or group of transistors, and FIG. 4(c) a package with a thinned IC chip mounted on a plate within the package including structure to pressurize the package cavity, according to various embodiments of the invention.

FIG. 4(a) shows a top view of a thinned IC chip 400 according to an embodiment of the invention. The thinned chip includes a main cavity 410. Within the main cavity are a plurality of smaller sub-cavities 415 better shown in FIG. 4(b). Individual thinned sub-cavities 415 may be etched for a single transistor or for a group of transistors, such as using a DRIE process. One or more transistors can be formed in each sub-cavity 415.

FIG. 4(c) shows packaged semiconductor device 450 comprising package 460 and thinned IC chip 400 having the lid off to reveal internal features according to the invention. Package includes contact pads 422 at its periphery which are wire bound to IC chip 400. Packaged device 450 provides external stress to the thinned IC chip 400 therein using a pressure difference applied across the chip. The package 460 includes a plate 465 upon which the chip 400 is mounted. The plate 465 is substantially airtight sealed to the periphery of the package 460 thus effectively isolating the volume above and below the plate 465. The package 460 includes a pressure valve 470 which permits a pressured gas flow to be provided from an external source, such as a pump (not shown), shown in FIG. 4(c) as applied below the plate 465. Alternatively, a vacuum can be pulled through pressure valve. The pressure difference across the plate forces the plate upward, which in turn induces the desired strain in the chip. By changing the applied pressure using a suitable pressure controller (not shown) in line with the pressure source, the strain on the chip can be changed.

Figure 5:
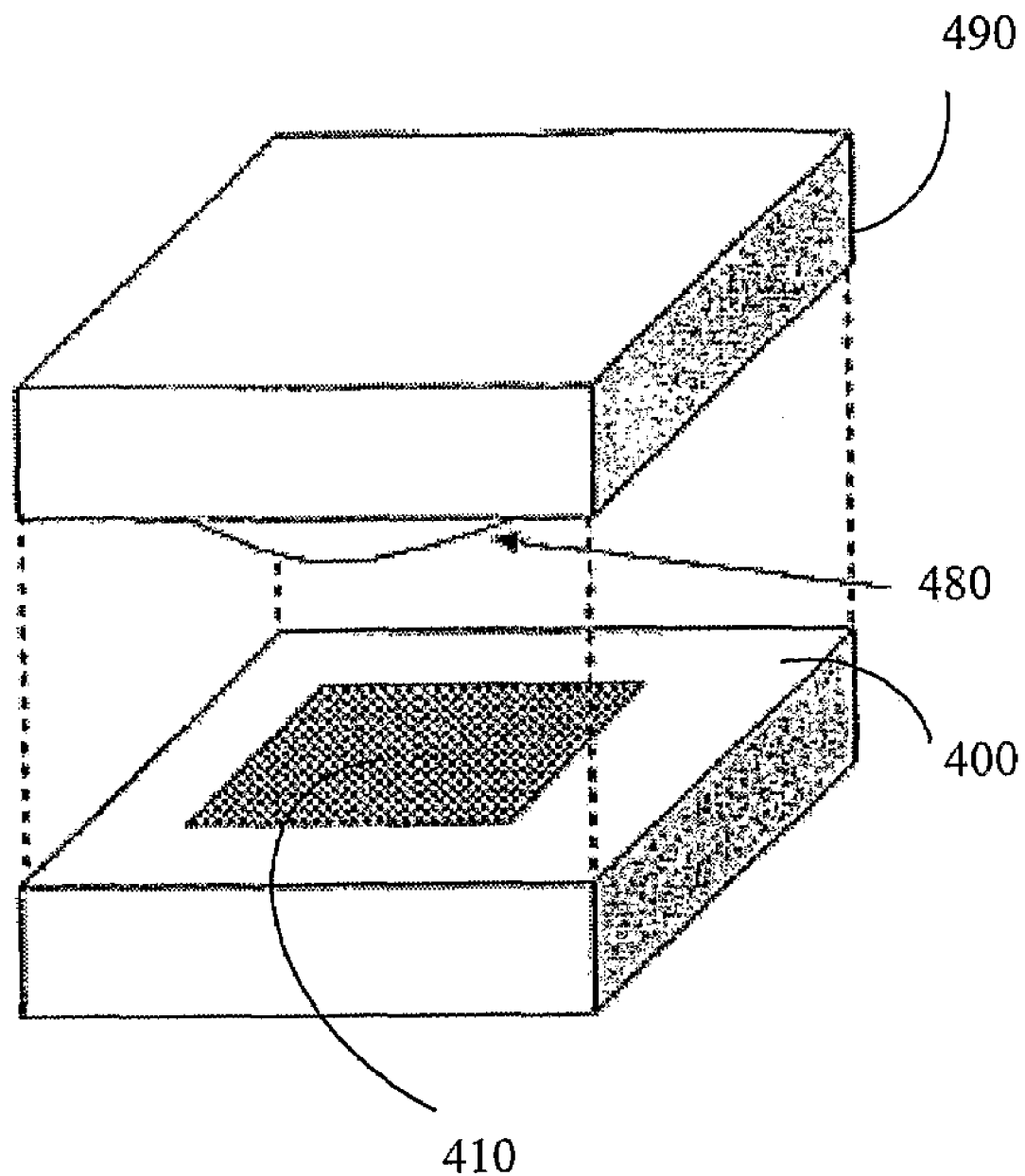
FIG. 5 shows the application of an external force via a package lid having a curved top surface that is compressed onto a thinned IC chip, according to an embodiment of the invention.

FIG. 5 shows yet another embodiment of the invention which applies an external force via a package lid 490 having a curved top surface 480 that is compressed (not shown) onto the cavity 410 of thinned IC chip 400. The material that comprises the protrusion is generally a polymer that is non-electrically conductive which is also preferably a good thermal conductor. The protrusion material may be the same material used to form the package, such as certain polymers, or be formed from different materials. The radius of curvature of the curved surface 480 corresponds to the desired applied external stress. The larger the radius of curvature, the higher the applied external stress applied to the chip 400.

EXAMPLES

It should be understood that the Examples described below are provided for illustrative purposes only and do not in any way define the scope of the invention.

Figure 6:
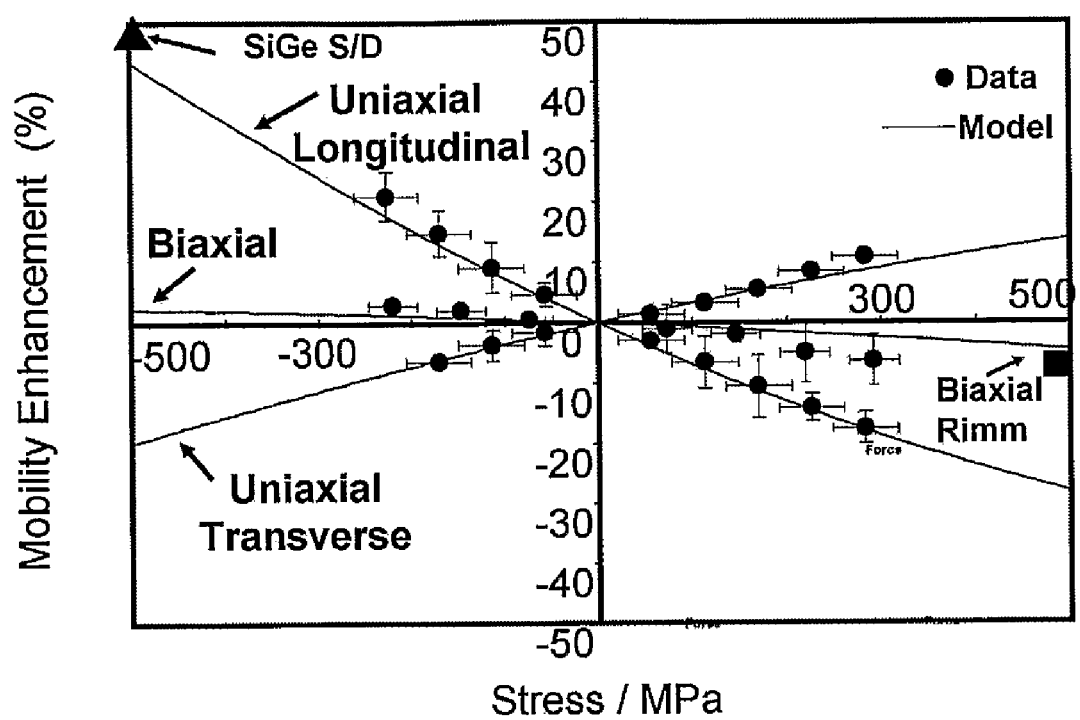
FIG. 6 shows mobility enhancement data from p-channel MOSFETs as a function of both uniaxial and biaxial stress on (100) silicon substrate using a 4-point bending apparatus. The mobility was extracted from changes in the linear drain current for the six possible types of stresses, compressive and tensile, longitudinal and transverse uniaxial stresses and compressive and tensile biaxial stresses.
Figure 7:
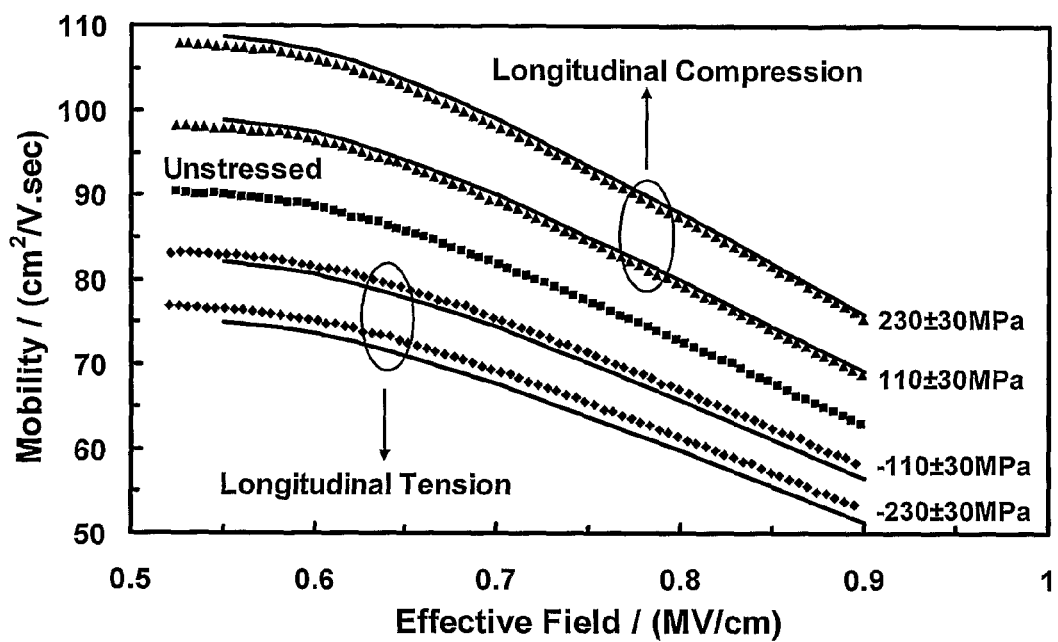
FIG. 7 shows enhanced hole mobility that was observed at both low and high vertical fields obtained with a concentric ring bending apparatus to apply external stress.

Transistors fabricated using a standard 90 nm CMOS technology were used in externally applied strains via wafer bending measurements. In the wafer bending experiments performed, the wafers were not selectively thinned and were thus about 700 microns thick throughout. Data was obtained regarding mobility enhancement as a function of externally applied strain on both n-channel and p-channel metal-oxide-semiconductor field-effect transistors (MOSFET). FIG. 6 shows mobility enhancement data from p-channel MOSFETs as a function of both uniaxial and biaxial stress on (100)

silicon substrate using a 4-point bending apparatus. The mobility was extracted from changes in the linear drain current for the six possible types of stresses, compressive and tensile, longitudinal and transverse uniaxial stresses and compressive and tensile biaxial stresses. In general, the wafer bending data support the published biaxial substrate and uniaxial process induced stress observations. Longitudinal uniaxial compressive stress is observed to cause much larger hole mobility enhancement at low and moderate stress on pMOSFETs. Furthermore, consistent with the uniaxial process stress data, enhanced hole mobility is observed at both low and high vertical fields for uniaxial longitudinal compressive stress as shown in FIG. 7 which was obtained with a 4-point bending apparatus. Note that tensile stress is positive and compressive stress is negative in FIG. 6.

It should be understood that the examples and embodiments described herein are for illustrative purposes only and that various modifications or changes in light thereof will be suggested to persons skilled in the art and are to be included within the spirit and purview of this application. The invention can take other specific forms without departing from the spirit or essential attributes thereof.

We claim:

1. A packaged semiconductor device, comprising:
   a semiconductor chip having at least one selectively thinned substrate region that forms an open cavity defined by an inner side of the thinned substrate region;
   a package that encloses the semiconductor chip, and
   a thin film having substantial residual stress that applies external stress to the thinned substrate region to induce strain in the thinned substrate region, the thin film being provided on the inner side of the thinned substrate region.

2. The device of claim 1, wherein the thinned substrate region has a thickness of less than 1 μm.

3. The device of claim 1, wherein the thin film comprises silicon nitride.

4. The device of claim 1, wherein a stress in the thinned substrate region is at least 1 GPa.

5. The device of claim 1, wherein the semiconductor chip comprises a thinned substrate device layer having a Young's modulus ($E_1$) disposed on a substantially thicker substrate having a Young's modulus $<E_1$.

6. The device of claim 1, wherein the thinned substrate region further comprises a plurality of sub-cavities.

7. A packaged semiconductor device, comprising:
   a semiconductor chip having at least one selectively thinned substrate region; and
   a package that encloses the semiconductor chip, the package including a curved top surface protrusion that is compressed against the thinned substrate region to induce strain in the thinned substrate region.

8. The device of claim 7, wherein the thinned substrate region has a thickness of less than 1 μm.

9. The device of claim 7, wherein a stress in the thinned substrate region is at least 1 GPa.

10. The device of claim 7, wherein the semiconductor chip comprises a thinned substrate device layer having a Young's modulus ($E_1$) disposed on a substantially thicker substrate having a Young's modulus $<E_1$.

11. The device of claim 7, wherein the thinned substrate region further comprises a plurality of sub-cavities.

12. The device of claim 7, wherein the package comprises a package lid and wherein the protrusion is formed on an inner side of the package lid that faces the thinned substrate region.

13. The device of claim 7, wherein the protrusion is formed of a polymer.

14. The device of claim 13, wherein the polymer is non-electrically conductive but thermally conductive.

* * * * *